United States Patent [19]

Blackstone et al.

[11] Patent Number: 4,546,375

[45] Date of Patent: Oct. 8, 1985

[54] VERTICAL IGFET WITH INTERNAL GATE AND METHOD FOR MAKING SAME

[75] Inventors: Scott C. Blackstone, Hopewell; Lubomir L. Jastrzebski, Plainsboro; John F. Corboy, Jr., Ringoes, all of N.J.

[73] Assignee: RCA Corporation, Princeton, N.J.

[21] Appl. No.: 439,563

[22] Filed: Nov. 5, 1982

[30] Foreign Application Priority Data

Jun. 24, 1982 [GB] United Kingdom ............... 8218283

[51] Int. Cl.[4] ............... H01L 27/12; H01L 29/04; H01L 29/78; H01L 27/02
[52] U.S. Cl. ............... 357/23.4; 357/4; 357/23.8; 357/23.14; 357/41; 357/59; 357/88
[58] Field of Search ...... 357/23 VD, 23 HV, 23 MG, 357/23 TF, 23 NS, 59, 88, 4, 41, 23.2, 23.4, 23.7, 23.8, 23.14, 22

[56] References Cited

U.S. PATENT DOCUMENTS

| | | | |
|---|---|---|---|
| 3,258,663 | 6/1966 | Weimer | 357/23 TF |
| 3,463,667 | 8/1969 | Chopra | 357/4 |
| 3,509,432 | 4/1970 | Aponick, Jr. et al. | 357/23 NS |
| 3,938,241 | 2/1976 | George et al. | 29/571 |
| 4,062,036 | 12/1977 | Yoshida | 357/88 |
| 4,070,690 | 1/1978 | Wickstrom | 357/68 |
| 4,115,793 | 9/1978 | Nishizawa | 357/22 |
| 4,145,700 | 3/1979 | Jambotkar | 357/23 |
| 4,145,703 | 3/1979 | Blanchard et al. | 357/55 |
| 4,249,190 | 2/1981 | Cho | 357/22 |
| 4,337,473 | 6/1982 | Nishizawa | 357/22 |
| 4,468,683 | 8/1984 | Dahlberg | 357/23 VD |
| 4,470,059 | 9/1984 | Nishizawa et al. | 357/22 |

FOREIGN PATENT DOCUMENTS

| | | |
|---|---|---|
| 22483A1 | 1/1981 | Fed. Rep. of Germany . |
| 1384750 | 11/1964 | France ............... 357/23 VD |
| 53-41985 | 4/1978 | Japan ............... 357/23 VD |
| WO81/00489 | 2/1981 | PCT Int'l Appl. ............... 357/22 |

OTHER PUBLICATIONS

IEEE Transactions, MTT-24, No. 6, 305-311, 1976, A Power Silicon Microwave MOS Transistor, J. G. Oakes et al.
IEEE Transactions, ED-27, No. 6, 1128-1141, 1980, Fabrication and Numerical Simulation of the Permeable Base Transistor, C. O. Bozler et al.
IEEE Transactions, ED-21, No. 1, 113-118, 1974, Ion-Implanted FET for Power Applications, D. P. Lecrosnier et al.
IEEE Electron Device Letters, EDL-1, No. 12, 250-252, 1980, A Novel Buried Grid Device Fabrication Technology, B. J. Baliga.

Primary Examiner—Andrew J. James
Assistant Examiner—J. Carroll
Attorney, Agent, or Firm—Birgit E. Morris; Donald S. Cohen; Kenneth R. Glick

[57] ABSTRACT

A vertical IGFET comprising a substantially planar silicon wafer with a source electrode on one major surface and a drain electrode on the opposite major surface is disclosed. An insulated gate electrode, which includes a conductive finger portion surrounded by an insulating layer, is internally disposed in the silicon wafer such that a predetermined voltage applied to the gate electrode will regulate a current flow between the source and drain electrodes. The device is fabricated utilizing an epitaxial lateral overgrowth technique for depositing monocrystalline silicon over the insulated gate which is disposed on a silicon substrate.

5 Claims, 7 Drawing Figures

VERTICAL IGFET WITH INTERNAL GATE AND METHOD FOR MAKING SAME

BACKGROUND OF THE INVENTION

The present invention relates to insulated gate field effect transistors (IGFETs). More particularly, it relates to vertical IGFETs which are substantially planar in structure and which are used in power switching applications.

Vertical IGFETs are so named because they incorporate source and drain electrodes on opposite surfaces of a semiconductor wafer. When a predetermined voltage is applied to a gate electrode, a vertical current flow between the source and drain electrodes is established. The gate electrode is typically insulated from the semiconductor surface by a silicon dioxide layer; such IGFETs being referred to as metal-oxide-semiconductor (MOS) FETs. Conventionally, the insulated gate electrode is disposed on the same semiconductor surface as the source electrode, as disclosed in U.S. Pat. No. 4,145,700, POWER FIELD EFFECT TRANSISTORS, issued Mar. 20, 1979, to C. G. Jambotkar, or it is disposed in a groove in a major semiconductor surface, as disclosed in U.S. Pat. No. 4,145,703, HIGH POWER MOS DEVICE AND FABRICATION METHOD THEREFOR, issued Mar. 20, 1979, to R. A. Blanchard et al.

Vertical IGFETs wherein the gate electrode is disposed on a major semiconductor surface are referred to as planar, vertical IGFETs herein, and are commonly referred to in the semiconductor industry as VDMOS (vertical, double diffused MOS) devices. Grooved, vertical IGFETs are commonly referred to in the semiconductor industry as VMOS devices. Being insulated gate structures, both VMOS and VDMOS devices are typically operated in the enhancement mode, and, being vertical devices, they are commonly used in power switching applications. When the predetermined voltage is applied to the gate electrode, a channel is formed in the semiconductor area immediately beneath the oxide of the insulated gate and provides a path for current flow between the source and drain electrodes. Thus, with a VDMOS device the channel is formed at a major semiconductor surface, and in a VMOS device the channel is formed along the surface of the groove in the major semiconductor surface. In both cases the gate electrode is externally disposed on the semiconductor wafer and therefore necessarily consumes a certain amount of surface area.

SUMMARY OF THE INVENTION

A novel vertical IGFET and method for fabrication are disclosed herein. A silicon wafer with first and second opposing major surfaces has a source electrode on the first surface and a drain electrode on the second surface. The gate electrode is internally disposed in the silicon wafer, and includes a finger portion which is surrounded by an insulating layer such as silicon dioxide. A predetermined voltage applied to the gate electrode finger portion will regulate current flow between the source and drain electrodes.

DETAILED DESCRIPTION

Figure 1:
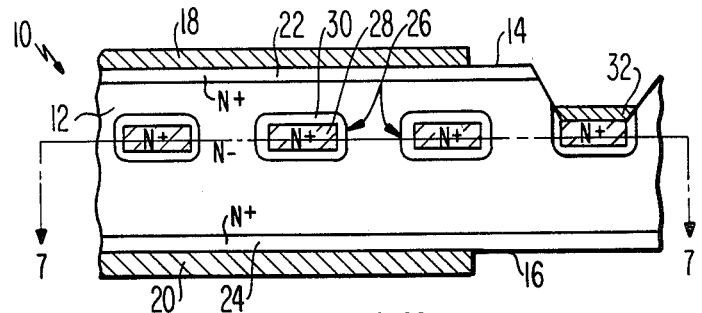
FIG. 1 is a sectional view of a depletion-type vertical IGFET device of the present invention.

Illustrated in FIG. 1 is an exemplary vertical, depletion-type IGFET device 10 incorporating the present invention. The device 10 comprises a substantially planar monocrystalline silicon wafer 12 having first and second opposing major surfaces 14 and 16, respectively. A source electrode 18 is disposed on the first surface 14 and a drain electrode 20 is disposed on the second surface 16. Portions of the wafer 12 adjacent to the major surfaces 14 and 16 are doped with N or P type conductivity modifiers so as to provide source and drain regions 22 and 24 in ohmic contact with the source and drain electrodes 18 and 20, respectively. With the exception of the insulated gate electrode, which will be described subsequently, the bulk of the silicon wafer 12, i.e., the volume between the source and drain regions 22 and 24, is of similar conductivity type to the source and drain regions, but of relatively low conductivity. For example, as illustrated, both the source and drain regions 22 and 24 might be of N+ type conductivity, having relatively high carrier concentrations of about $10^{19}$ cm$^{-3}$, whereas the bulk of the wafer 12 might be of N− type conductivity, having a carrier concentration of about $10^{15}$ cm$^{-3}$.

It should be noted that although the FIG. 1 illustration shows the source and drain regions 22 and 24 to be present only near the wafer surfaces 14 and 16, the structure is not so limited. In that the regions 22 and 24 serve to reduce source-to-drain resistance, it may be desirable, for example, to have these regions extend more deeply into the wafer. Such an example will be shown subsequently, in a description of enhancement-type device 40 of FIG. 2.

In the preferred embodiment shown in FIG. 1, a plurality of insulated gate fingers 26 are disposed along a plane which is internal to the wafer 12 and which is substantially parallel to the major surfaces 14 and 16. It should be noted, however, that a functional device could also be formed utilizing a single gate finger 26. In the preferred embodiment the fingers are arranged in a ladder-shaped pattern, as further illustrated in FIG. 7, although it should be recognized that the finger configuration is not limited to this pattern. Each finger 26 incorporates a gate electrode 28, of, for example, relatively heavily doped polycrystalline silicon, and is surrounded by an insulating layer 30 of, for example, silicon dioxide. External electrical connection to the insulated gate fingers 26 is made by a gate electrode contact 32 in direct ohmic contact with a portion of the gate electrode 28.

The design spacing between opposing fingers is determined by the size of the depletion region which each finger will generate in the semiconductor region 29 therebetween when the gate electrode 28 is appropriately biased. Thus, in the depletion-type device 10, wherein it is desirable to pinch off a "normally on" source-to-drain current, the maximum spacing between opposing insulated gate fingers 26 should be approximately twice the distance that the depletion region of each finger 26 extends into the semiconductor region 29 between fingers.

Figure 2:
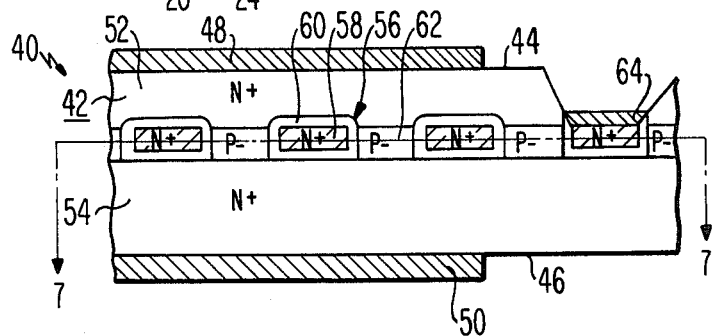
FIG. 2 is a sectional view of an enhancement-type vertical IGFET device of the present invention.

Illustrated in FIG. 2 is a vertical, enhancement-type IGFET 40 of the present invention. The basic structure of the enhancement-type device 40 is similar to that of the depletion-type device 10. The device 40 also incorporates a silicon wafer 42, having first and second opposing major surfaces 44 and 46 respectively, with source and drain electrodes 48 and 50 respectively, disposed thereon. Source and drain regions 52 and 54, of first conductivity type, extend into the wafer from the first and second surfaces 44 and 46, and a plurality of insulated gate fingers 56 are disposed along an internal plane of the wafer which is substantially parallel to the major surfaces. The source and drain regions 52 and 54 extend to the plane on which the insulated gate fingers lie so as to define a body region 62 of second conductivity type, between each pair of neighboring fingers 56. In the preferred embodiment, the source and drain regions are of relatively high conductivity compared to the body regions. Additionally, the conductivity of the source and drain regions 52 and 54 might be graded, e.g., higher at the wafer surface(s) than near the body regions 62.

Each insulated gate finger 56 again includes a gate electrode 58 of, for example, relatively heavily doped polycrystalline silicon, and is surrounded by an insulating layer 60 of, for example, silicon dioxide. An external gate electrode contact 64 ohmically contacts the gate electrode 58.

Figure 7:
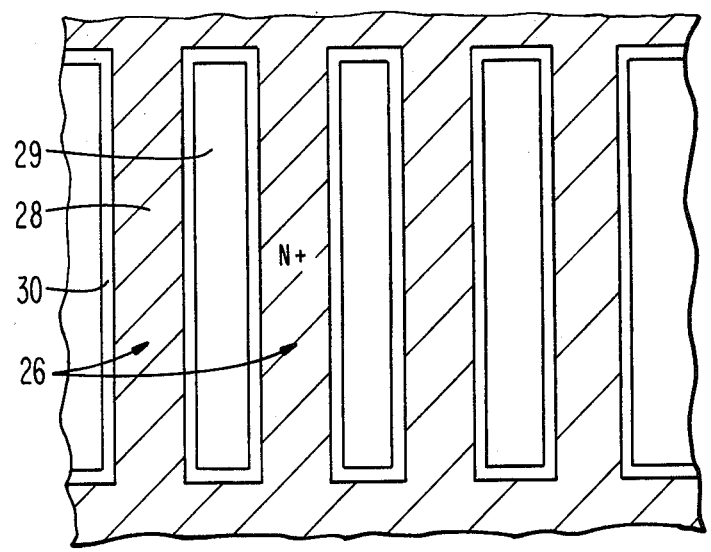
FIG. 7 illustrates an exemplary configuration of the gate electrode in devices of the present invention. It illustrates the view taken through section line 7-7 in FIGS. 1 and 2.

A variety of gate finger configurations is also possible with the enhancement-type device, although in the preferred embodiment, a ladder-shaped structure, as illustrated in FIG. 7, is used. It should be noted, however, that in an enhancement-type device there are fewer restrictions on the gate finger configuration. Since an enhancement-type device is normally off, there is no necessity for each gate finger to be in proximity to a structure such as an opposing finger, against which source-to-drain current is pinched off. Operationally, the IGFET 40 behaves as a typical enhancement-type device. The device is normally off, and current flow between the source and drain electrodes 48 and 59 is regulated by a voltage applied to the insulated gate fingers 56. When a predetermined voltage is applied to the gate electrodes 58 via gate electrode contact 64, a conductive channel region is created in each body region 62 in an area adjacent to the gate oxide 60.

Figure 3:
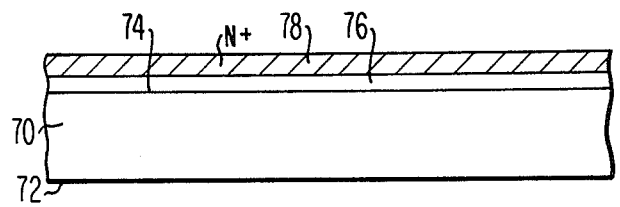
FIGS. 3-6 illustrate the basic process sequence used to fabricate a vertical IGFET of the present invention.

The basic processing steps for fabricating the devices 10 or 40 of FIGS. 1 and 2 are shown in FIGS. 3–6. As shown in FIG. 3, the starting point for processing is a monocrystalline silicon substrate 70 having opposing major surfaces 72 and 74. Depending upon whether a depletion-type device or an enhancement-type device is being fabricated, the substrate 70 will be doped with an appropriate concentration of a particular conductivity modifier. A relatively heavy dopant concentration may be desirable so as to decrease power dissipation in the completed device. On the other hand, a relatively low concentration may be desirable for ease of device fabrication.

A first silicon dioxide layer 76 is formed across the substrate surface 74. A first oxide layer 76 might have a thickness of approximately 1000 Angstroms and it can be formed, for example, by thermal oxidation. A polycrystalline silicon layer 78 is then formed across the first oxide layer 76. The thickness of the polycrystalline silicon layer 78 will ultimately determine gate length and it might have a value in the approximate range of 5000–20,000 Angstroms. As is illustrated, the polycrystalline silicon layer 78 is relatively heavily doped to a particular conductivity type. This doping can be performed either during the polycrystalline silicon deposition or following the deposition by conventional doping or ion implantation procedures.

Figure 4:
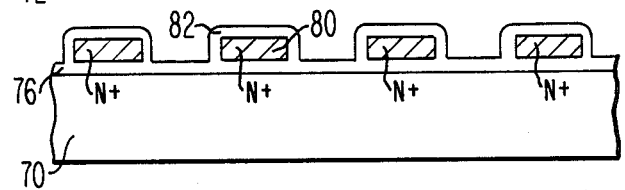
Figure 5:
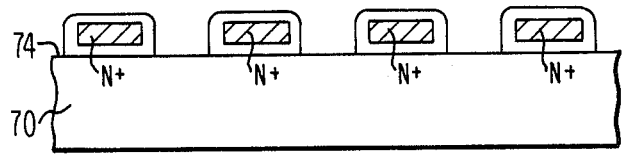

The doped polycrystalline silicon layer 78 is next photolithographically defined so as to form a finger pattern, and each of the fingers is oxidized so as to form a surrounding second silicon dioxide layer 82, as illustrated in FIG. 4. The first silicon dioxide layer 76 is then removed from areas of the substrate surface 74 between the oxidized fingers 80, as illustrated in FIG. 5. This may be accomplished photolithographically, for example, by first protecting the oxidized fingers 80 with photoresist and then etching the first silicon dioxide layer 76.

Figure 6:
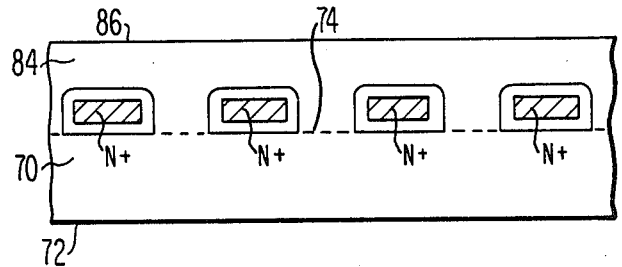

As shown in FIG. 6, an epitaxial silicon layer 84 is next grown from the exposed surface 74 such that it fills the space between oxidized fingers 80 and forms a layer of monocrystalline material over all of the oxidized fingers. The surface of this epitaxial layer is identified at 86 in FIG. 6, and it will ultimately form the first wafer surface 14 or 44 illustrated in FIGS. 1 or 2, respectively. The epitaxial layer 84 can be formed by what is now referred to as the epitaxial lateral overgrowth (ELO) technique, as elaborated upon in U.S. patent application Ser. No. 338,958, Method For Growing Monocrystalline Silicon On A Mask Layer, filed Jan. 12, 1982, by Corboy et al., and U.S. Pat. No. 4,482,422, Method For Growing A Low Defect Monocrystalline Silicon Layer On A Mask, issue Nov. 13, 1984, to J. T. McGinn et al.

Basically, the ELO process involves a repetitious, two-stage, deposition/etch cycle whereby monocrystalline silicon is grown from a monocrystalline silicon surface which is exposed within the apertures of an overlying silicon dioxide mask. When the silicon which is being epitaxially deposited grows through the apertures to a thickness greater than that of the mask, the epitaxial growth proceeds laterally, across the surface of the mask, as well as vertically. Ultimately, a continuous monocrystalline silicon layer overlying the apertured mask is formed.

As elaborated upon in the cited patent applications, the deposition/etching cycle can be performed within a conventional reactor at atmospheric or reduced pressure. During the deposition phase of the cycle the substrate is exposed to a gas mixture which comprises a silicon-source gas such as $SiH_2Cl_2$ and a carrier gas such as hydrogen. Additionally, it may be desirable to include a silicon-etching gas such as HCl during the deposition phase. During the etching phase of the cycle the substrate is exposed to a gas mixture comprising an etching gas such as HCl and a carrier gas such as hydrogen.

During the deposition phase silicon deposits from the silicon-source gas onto exposed surfaces of the substrate and mask. The silicon that deposits on the monocrystalline substrate surface follows the monocrystalline lattice structure at that site, whereas the silicon which precipitates onto the mask deposits in the form of isolated, non-single-crystalline aggregates. The gas composition and duration of the etching phase is designed so as to completely remove all of the non-single-crystalline aggregates which were formed on the mask following the deposition phase. Although this etching also removes some of the monocrystalline silicon growing from the exposed area of the monocrystalline substrate, the etch rate of this monocrystalline silicon is relatively low compared to the etch rate of the non-single-crystalline aggregates. Thus, after a single deposition/etching cycle, more silicon is deposited on exposed silicon surfaces during the deposition phase than is etched during the etching phase, and all of the deposited material is monocrystalline in nature.

The monocrystalline silicon deposited by the ELO process can also be simultaneously doped as it is being deposited. For example, in the depletion-type device 10, arsenic or some other N type conductivity modifier can be introduced during the deposition phase of the deposition/etching cycle. Additionally, when this is done, the dopant concentration can optionally be varied during the deposition so as to yield a conductivity gradient in the deposited layer. When fabricating the enhancement-type device 40, a P type dopant such as boron can be introduced during the initial phase of the deposition cycle so as to form P type body regions 62. The P type dopant can then be replaced with an N type dopant after the epitaxial deposit has achieved a thickness approximately equal to that of the oxidized fingers. Thus, the depth of the N+ source region 22 in the depletion-type device 10, and the depth of the N+ source region 52 in the enhancement-type device 40 can readily be varied during the ELO deposition process. Alternatively, high-conductivity source regions 22 and 52 can be fabricated by a process such as ion implantation after the ELO layer is formed. Such an ion implantation might also be used to form high-conductivity drain regions 24 and 54.

In the case of both depletion-type device 10 and enhancement-type device 40, a contact opening through the epitaxial layer 84 can next be made so as to expose an area of heavily doped polycrystalline silicon 28 or 58 where the external gate electrode contact will be formed. External source, gate and drain electrode contacts 18, 32 and 20, or 48, 64 and 50 can then be formed in a conventional manner, such as evaporation, using a conventional electrode material, such as aluminum.

In addition to being a novel structure, devices of the present invention provide several advantages over conventional VDMOS and VMOS devices. The source electrode contacts 18 and 48 are substantially planar structures. In addition to providing greater contact area to the corresponding source regions 22 and 52, these planar ohmic contacts are relatively easy to fabricate. The large contact area between the source electrode contact and the source region also lowers the contact resistance at that interface.

The fabrication process for making the devices 10 and, 40 is also relatively simple. Conventional VDMOS and VMOS devices require single or multiple ion implantations so as to define source and body regions. These implantations are not required in devices of the present invention. There is only a single critical photolithographic step in the fabrication sequence for devices of the present invention; the patterning of the gate electrode. In contrast, conventional devices require several critical photolithographic steps both for fabricating internal semiconductor regions and external electrode contacts. Furthermore, the need for an insulating layer between conventional multilevel source and gate electrode contacts on the semiconductor surface is eliminated by the source and gate electrode contact configuration described herein. Lastly, the structure and fabrication process described herein provides a readily manufacturable depletion device. The fabrication of conventional depletion-type devices requires etching deep grooves into the semiconductor and deep diffusions for doping the sides of these grooves. The present invention eliminates the need for deep etchings and diffusions as well as the need for depositing electrode material on the walls of the semiconductor grooves.

What is claimed is:

1. A vertical, enhancement-type IGFET device, comprising:
    a monocrystalline silicon wafer having first and second opposing major surfaces;
    a substantially planar source electrode disposed on the first surface;
    a drain electrode disposed on the second surface; and
    an insulated gate electrode having a doped polycrystalline silicon conductive finger portion which is surrounded by an insulating layer and by monocrystalline silicon, said insulated gate electrode being internally disposed within the monocrystalline silicon wafer, the silicon that is disposed between the finger and each of the major surfaces being of first conductivity type so as to form a source region at the first surface and a drain region at the second surface, and the silicon that is disposed adjacent to the finger and between the source and drain regions being of second conductivity type, such that a predetermined voltage applied to the insulated gate electrode will regulate a current flow between the source and drain electrodes.

2. A device in accordance with claim 1, wherein the insulated gate electrode further comprises:
    a plurality of conductive finger portions.

3. A device in accordance with claim 2, wherein:
    said finger portions are disposed on a plane which is substantially parallel to the major wafer surfaces.

4. A device in accordance with claim 2, wherein:
    said finger portions are arranged in a ladder-shaped pattern.

5. A device in accordance with claim 1, wherein:
    the insulating layer surrounding the conductive finger portion comprises silicon dioxide.

* * * * *